United States Patent

Baumann et al.

[11] Patent Number: 5,985,996
[45] Date of Patent: Nov. 16, 1999

[54] ACETAL POLYMERS AND USE THEREOF IN PHOTOSENSITIVE COMPOSITIONS AND LITHOGRAPHIC PRINTING PLATES

[75] Inventors: Harald Baumann, Osterode; Udo Dwars, Herzberg; Celin Savariar-Hauck, Badenhausen; Hans-Joachim Timpe, Osterode, all of Germany

[73] Assignee: Kodak Polychrome Graphics LLC, Norwalk, Conn.

[21] Appl. No.: 08/917,631

[22] Filed: Aug. 22, 1997

Related U.S. Application Data

[62] Division of application No. 08/675,024, Jul. 3, 1996, Pat. No. 5,700,619.

[30] Foreign Application Priority Data

Jul. 7, 1995 [DE] Germany .......................... 195 24 851

[51] Int. Cl.$^6$ .................................................. C08F 8/00
[52] U.S. Cl. .............................................. 525/59; 525/61
[58] Field of Search ........................................ 525/59, 61

[56] References Cited

U.S. PATENT DOCUMENTS

| | | | |
|---|---|---|---|
| 2,513,190 | 6/1950 | McQueen ................................. | 525/56 |
| 3,627,783 | 12/1971 | Watchung .............................. | 548/505 |
| 4,304,832 | 12/1981 | Ohta et al. ............................. | 430/175 |
| 4,631,245 | 12/1986 | Pawlowski ............................. | 430/175 |
| 5,219,699 | 6/1993 | Walls et al. ............................ | 430/156 |

FOREIGN PATENT DOCUMENTS 0092901  11/1983  European Pat. Off. .

*Primary Examiner*—Judy M. Reddick
*Attorney, Agent, or Firm*—Ratner & Prestia

[57] ABSTRACT

This invention relates to a binder containing the units A, B, C, D and E, wherein A is present in an amount of 10 to 60 mole % and is of the formula

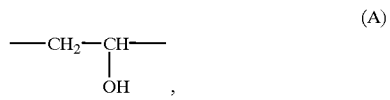
(A)

B is present in an amount of 1 to 30 mole % and is of the formula

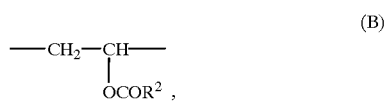
(B)

C is present in an amount of 5 to 60 mole % and is of the formula

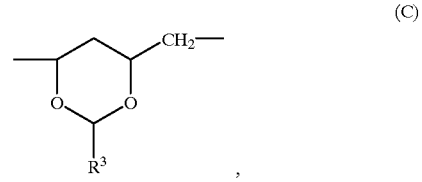
(C)

D is present in an amount of 0 to 60 mole % and is of the formula

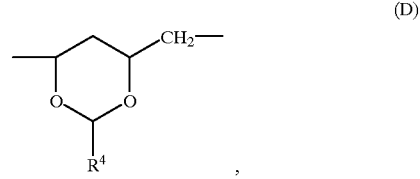
(D)

and E is present in an amount of 1 to 40 mole % and is of the formula

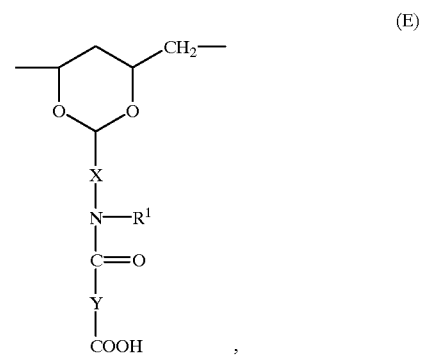
(E)

wherein

X is an aliphatic, aromatic or araliphatic spacer group, $R^1$ is hydrogen or an aliphatic, aromatic or araliphatic group, $R^2$, $R^3$ and $R^4$ are hydrogen or alkyl groups with carbon numbers of from 1 to 18 and Y is a saturated or unsaturated chain- or ring-shaped spacer group, and photosensitive compositions containing this binder.

4 Claims, No Drawings

ACETAL POLYMERS AND USE THEREOF IN PHOTOSENSITIVE COMPOSITIONS AND LITHOGRAPHIC PRINTING PLATES

This application is a division of application Ser. No. 08/675,024, filed Jul. 3, 1996 now U.S. Pat. No. 5,700,619.

The present invention relates to binders and photosensitive compositions comprising said binders and inter alia excellently suitable for the production of lithographic plates.

Nowadays, photosensitive compositions usable particularly for high-performance lithographic plates must fulfill high requirements.

The discussion of improving the properties of photosensitive compositions and thus also of the corresponding lithographic plates essentially deals with two different ways. One of them deals with the improvement of the properties of the photosensitive components in the compositions (frequently diazo resins, photo polymers etc.), the other one with the search for novel polymeric compounds ("binders") which are to control the physical properties of the photosensitive layers. In particular the latter way is decisive for lithographic plates because the behavior in the developing and printing processes (such as developability, ink receptivity, scratch resistance, consistency in the number of prints produced) is decisively influenced by the polymeric binders. Also shelf life and photosensitivity of the materials are strongly influenced by the polymeric compounds.

The polymeric binders therefore exhibit various structural elements for satisfying the extensive requirements, which may have different effects on individual properties. For instance, hydrophilic structural elements such as carboxyl groups, hydroxyl groups and the like generally promote the developability of the photosensitive compositions in aqueous alkaline developers and partly ensure sufficient adhesion to polar substrates. Hydrophobic structural elements, on the other hand, reduce the capability of being developed in the above-mentioned developers, but ensure the good ink receptivity used in the printing process, which is indispensable in lithographic plates.

Due to the broad range of requirements regarding the polymeric binders, for many years there have been extensive studies on the synthesis and optimization of these substances for photosensitive compositions, cf. e.g. H. Baumann and H.-J. Timpe: "Chemical Aspects of Offset Printing" in *J. prakt. Chem./Chemiker-Zeitung* [Journal for chemists] 336 (1994) pages 377–389.

EP-A-135 026, EP-A-186 156 and U.S. Pat. No. 4,731, 316 describe binder systems consisting of compositions of polymers having different hydrophilic/hydrophobic properties. However, such compositions involve the disadvantage that very frequently incompatibilities between the different substances lead to separation during the formation of layers. Furthermore, it was found that the hydrophobic polymers precipitate during the developing process, which may lead to silting in the developing machines.

Furthermore, copolymers consisting of only slightly hydrophilic monomers such as styrene, acrylic acid ester, methacrylic acid ester and the like with hydrophilic comonomers were described. Examples of such comonomers are semi-esters of maleic acid (DE-A-31 30 987, EP-B-71 881, EP-A-104 863), itaconic acid (EP-A1-397 375, U.S. Pat. No. 5,260,161) and acrylic acid and/or methacrylic acid (EP-A-487 343, U.S. Pat. No. 4,304,832, U.S. Pat. No. 4,123,276). The very tight play of the properties important for the use, which are layer adhesion, developability and printing ink receptivity proved to be disadvantageous in such polymers. Variations in the polymers' composition can hardly be avoided during the production process, which leads to unacceptable fluctuations in the plates' properties.

DE-A-27 51 060 describes photosensitive compositions, wherein the binder is a reaction product of cellulose esters with cyclic, intermolecular acid anhydrides of dicarboxylic acids. These binders, however, are not oleophilic enough for the use in lithographic plates formulations.

Polymers that contain urethane groups were also described as binders for photosensitive compositions (EP-A2-415 302, EP-A1-406 599, EP-A1-406 600, EP-A2-414 099, U.S. Pat. No. 4,983,491, U.S. Pat. No. 4,950,582, U.S. Pat. No. 4,877,711). The necessary functionalization with such hydrophilic groups, however, requires very high efforts regarding synthesis and involves high costs.

Extensive studies have been carried out on polyvinyl acetals as binders for photosensitive compositions. In order to achieve sufficient developability in the case of a use in offset printing molds, various directions have been taken.

If, as described in EP-B1-216 083, only pure aliphatic aldehydes are used for the acetalization of the polyvinyl alcohols, depending on the degree of reaction the result are either poorly adhesive layers or mixtures with too low a developability.

Although, the relation between adhesion and developability is improved in the acetalization with purely aliphatic aldehydes in combination with OH groups containing aliphatic aldehydes claimed in EP-B1-274 075, the practical requirements cannot be met yet. To improve developability, in DE-20 53 363, DE-20 53 364 and EP-B1-48 876 sulfonyl urethane groups were introduced into polyvinyl acetals. The low acidity of these groups, however, makes developers necessary that contain a high portion of solvents. In addition, micro-elements of such prepared lithographic plates exhibit very low adhesion so that wear takes place rapidly during the printing process.

GB-1 396 355 describes binders that may be prepared by acetalization of saponified copolymers from vinyl acetate and a carboxyl group bearing monomer such as crotonic acid. This kind of binders, however, leads to systems with low photosensitivity and little consistency in the number of prints produced when used for lithographic molds. EP-B1-211 391 and EP-B1-152 819 introduce the carboxyl groups by reaction of separately prepared acetals of aliphatic aldehydes with polyvinyl alcohol with intermolecular, cyclic acid anhydrides of dicarboxylic acids. The efforts necessary for synthesis, however, are extensive since the reaction with the acid anhydrides, which is only possible in aprotic solvents, must take place in addition to the acetalization. Furthermore, the photosensitivity of the mixtures produced from these binders is still too low. EP-B1-208 145 describes binders produced in a three-step synthesis starting from polyvinyl alcohol: acetalization with aliphatic aldehydes, reaction with intermolecular, cyclic acid anhydrides of dicarboxylic acids and partial esterification of the carboxyl groups with substituted alkyl halides. Despite the extensive effort required for the binder synthesis, improved photosensitivity of the coatings prepared therefrom is still desirable. The effort of the multi-step synthesis may be avoided if, as described in PCT-WO-93/03068, U.S. Pat. No. 4,652,604, U.S. Pat. No. 4,895,788, U.S. Pat. No. 4,940,646 and U.S. Pat. No. 5,169,897, polyvinyl alcohol is reacted with aliphatic aldehydes and carboxyl groups containing aromatic aldehydes. The photosensitive compositions produced therefrom, however, have an undesired relationship between developability and sensitivity.

Despite this intensive research carried out in the field of photosensitive compositions for lithographic plates, all existing compositions make improvement appear desirable, in particular regarding their sensitivity, developability and the number of prints produced. Furthermore, many of the compositions exhibit a high number of partially rather expensive components, which make an economical use impossible.

It is thus the object of this invention to provide binders and photosensitive compositions comprising said binders and doing with as few components as possible vis-a-vis the compositions described in the state of the art (which makes them economically desirable) and still having the same or—in individual areas—improved physical properties. In particular, an improved photosensitivity, improved printing ink receptivity and/or an increased number of prints produced from the corresponding lithographic plates vis-a-vis the compositions described in the state of the art are to be achieved.

Another object underlying this invention is the use of such photosensitive compositions for preparing lithographic plates.

These objects are achieved by a photosensitive composition comprising:

(i) a diazonium polycondensation product or a free radical polymerizable system consisting of photoinitiators and unsaturated compounds which are free radical polymerizable or a hybrid system consisting of a diazonium polycondensation product and a free radical polymerizable system consisting of photoinitiators and unsaturated compounds which are free radical polymerizable, (ii) a binder and optionally one or more exposure indicator(s), one or more dye(s) for increasing the contrast of the image as well as one or more acid(s) for stabilizing the photosensitive composition, characterized in that the binder consists of units A, B, C, D and E, wherein A is present in an amount of 10 to 60 mole % and is of the formula

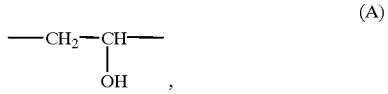

(A)

B is present in an amount of 1 to 30 mole % and is of the formula

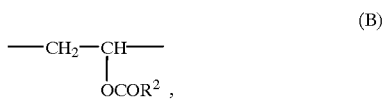

(B)

C is present in an amount of 5 to 60 mole % and is of the formula

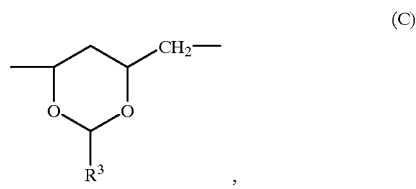

(C)

D is present in an amount of 0 to 60 mole % and is of the formula

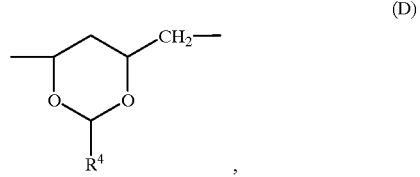

(D)

and E is present in an amount of 1 to 40 mole % and is of the formula

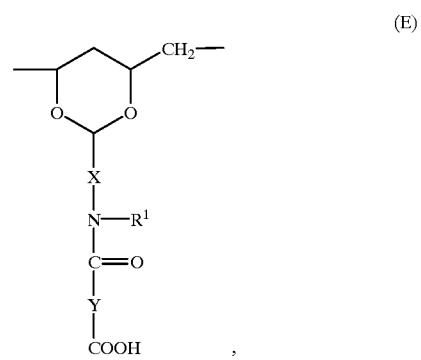

(E)

wherein

X is an aliphatic, aromatic or araliphatic spacer group, $R^1$ is hydrogen or an aliphatic, aromatic or araliphatic moiety $R^2$, $R^3$ and $R^4$ are hydrogen or alkyl groups with carbon numbers of from 1 to 18 and Y is a saturated or unsaturated chain- or ring-shaped spacer group.

The surprising advantages of the invention are that by means of a rather simple synthesis and starting from inexpensive polymers available in large-scale technology, specific polymers can be prepared. A wide variety of properties of the thus obtained polymer can be exactly adjusted due to the multitude of possibilities offered by the method of this invention regarding kind and amount of the carboxyl group bearing moiety HOOC—Y—CO—NR$^1$—X—CH(O—)$_2$, the choice of hydrophobic substituents $R^3$ and $R^4$, the amount of esterified OH groups as well as the choice of molecular weight of the polymer to be modified. This way, tailor-made polymers can be obtained suitable for various photo-crosslink mechanisms.

Besides, it was found that the obtained photosensitivities and the chemical and mechanical properties of the photosensitive compositions can be considerably improved, in particular for the use in offset lithographic plates.

The first essential component of the photosensitive composition of this invention is a polyvinyl alcohol, the OH groups of which are acetalized with different moieties.

The polyvinyl alcohols preferably used for the synthesis have a residual content of esterified groups in the range of from 0.3 to 30 wt. %. More preferred are polyvinyl alcohols prepared starting from polyvinyl acetate, i.e. $R^2$=CH$_3$ with a residual acetate content of from 1.5 to 22 wt. %. The behavior in alkaline developers and the photosensitivity of the photosensitive compositions produced can be influenced by the molecular weight of the polyvinyl alcohols used in the synthesis. Preferably used polyvinyl alcohols exhibit viscosities of between 2 and 26 mPa.s as 4% aqueous solution in water at 20° C.

The acetalization of the polyvinyl alcohols takes place according to known standard methods; examples are described in EP-B-216 083 and DE-A-28 38 025.

The acetal moieties can be represented starting from aldehydes $R^3CHO$, $R^4CHO$ and $HOOC-Y-CO-NR^1-X-CHO$ or acetals of these aldehydes $R^3CH(OR^9)_2$, $R^4CH(OR^9)_2$, or $HOOC-Y-CO-NR^1-X-CH(OR^9)_2$, wherein $R^9$ is alkyl. This reaction generally requires the addition of a strong inorganic or organic catalyst acid. Examples of catalyst acids are hydrochloric acid, sulfuric acid, phosphoric acid or p-toluenesulfonic acid. A particularly preferred catalyst acid is hydrochloric acid. The amount of acid added should preferably be 1 to 25 wt. % based on the amount of polyvinyl alcohol used.

The reaction temperature of the acetalizations depends on the kind of aldehyde as well as the desired amount of reaction. It is between 0° C. and, if applicable, the boiling point of the used solvent. Preferably the temperatures are between 5° C. and 100° C.

Organic solvents as well as mixtures of water with organic solvents are used as acetalization agents. Particularly suitable organic solvents are alcohols (such as methanol, ethanol, propanol, butanol or glycol ether), cyclic ethers (such as tetrahydrofuran, 1,4,-dioxane, 1,3-dioxolane) or dipolar aprotic solvents (such as dimethyl sulfoxide, formamide, N,N-dimethyl formamide, hexamethyl phosphoric acid triamide or N-methyl pyrrolidone). If the acetalization is carried out in organic solvents or mixtures of organic solvents with water, the reaction product often remains in solution even if the starting polyvinyl alcohol was not completely dissolved. This offers the advantage that the degree of reaction is relatively easy to reproduce. The sequence of the addition of the various acetalization agents is often of no importance and comparable finished products are obtained from different preparation sequences. To isolate the finished product as a solid, the polymer solution is introduced into a non-solvent under stirring, filtered off and dried. Water is especially suitable as non- solvent for the polymer. Another, also practicable method is to add the non-solvent for the polymer under stirring to the synthesis solution. In this method too, water is a preferred non-solvent.

For obtaining certain properties of the polymeric binder, it may be advantageous to isolate the polymer between individual acetalization steps by means of precipitation, and to continue the acetalization upon dissolution in an optionally different solvent than that of the previous acetalization step.

The moieties $R^3$ and $R^4$ are hydrogen or branched or straight-chain alkyl groups having preferably 1 to 18 carbons, more preferably 1 to 6 carbons. Particularly preferred is the synthesis starting from acetaldehyde, propionaldehyde and butyraldehyde and/or their acetals of low alcohols $R^9OH$.

The carboxyl group bearing acetal is readily introduced under the above conditions starting from aldehydes $HOOC-Y-CO-NR^1-X-CHO$ or acetals of these aldehydes $HOOC-Y-CO-NR^1-X-CH(OR^9)_2$. The preparation of the aldehydes or acetals necessary for the polymer synthesis is also easily possible starting from the corresponding amine $NHR^1-X-CH(OR^9)_2$ by reaction with an intermolecular, cyclic carboxylic acid anhydride of formula I.

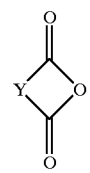

The reaction takes place quantitatively at room temperature in aprotic solvents. Preferred solvents are benzene, toluene, xylene, tetrahydrofuran, 1,4-dioxane, 1,3-dioxolane and the like. When an appropriate solvent is chosen, it can be achieved that the final product is insoluble in the solvent and precipitates. Appropriate solvents for this are non-polar solvents such as hexane, cyclohexane and the like. Another variant is to prepare $HOOC-Y-CO-NR^1-X-CH(OR^9)_2$ in the solvent suitable for the reaction to form the polymer and to thus avoid having to isolate it as a free substance. Particularly suitable solvents for this are cyclic ethers (such as tetrahydrofuran, 1,4-dioxane, 1,3-dioxolane) or dipolar aprotic solvents (such as dimethyl sulfoxide, formamide, N,N-dimethyl formamide, hexamethyl phosphoric acid triamide or N-methyl pyrrolidone). Under certain conditions it may be advantageous to use the free aldehyde $HOOC-Y-CO-NR^1-X-CHO$ when introducing the carboxyl group bearing acetal group. It is easily accessible by means of a mild hydrolysis from the above-described acetal.

The amine $NHR^1-X-CH(OR^9)_2$ used for the reaction with the intermolecular, cyclic carboxylic acid anhydride of formula I may comprise a hydrogen, a branched or straight-chain alkyl, an aryl or aralkyl as substituent $R^1$, preferably hydrogen and alkyl. A more preferred moiety $R^1$ is hydrogen or a methyl group. The spacer group X may be of aliphatic, aromatic or araliphatic nature. Preferably used spacer groups are $-CH_2-$, $-CH(CH_3)-$ or $-CH_2CH_2CH_2-$.

The following compounds are suitable intermolecular, cyclic carboxylic acid anhydrides of formula I:

maleic anhydride and derivatives thereof (such as dimethyl maleic anhydride or citraconic anhydride), phthalic acid anhydride and its substitution products (such as chloro-, nitro- and carboxyphthalic acid anhydride) and hydrogenation products (such as tetrahydrophthalic acid anhydride), succinic anhydride and derivatives thereof (such as methyl succinic anhydride), glutaric anhydride and derivatives thereof (such as 3-oxaglutaric anhydride, 3-methylglutaric anhydride, 3,3-tetramethylene glutaric anhydride or camphoric anhydride), naphthalenedicarboxylic acid anhydride and its substitution products (such as naphthalene-2,3-dicarboxylic acid anhydride and naphthalene-1,8-dicarboxylic acid), pyridine-o-carboxylic acid anhydride and its substitution products, pyrazine-o-carboxylic acid anhydride and its substitution products, o-furancarboxylic acid anhydride and its substitution products, thiophene-o-carboxylic acid anhydride and thiophene-2,5-dicarboxylic anhydride, the substitution products thereof as well as the completely or partially hydrogenated derivatives thereof and di- or polycyclic anhydrides resulting from Diels-Alder reaction of a diene with maleic anhydride (such as addition products from furan, anthracene, cyclohexadiene-1,3, or cyclopentadiene and maleic anhydride).

More preferred are maleic, phthalic acid, tetrahydrophthalic acid, succinic and 3-oxaglutaric acid anhydride The spacer group Y is preferably

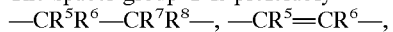

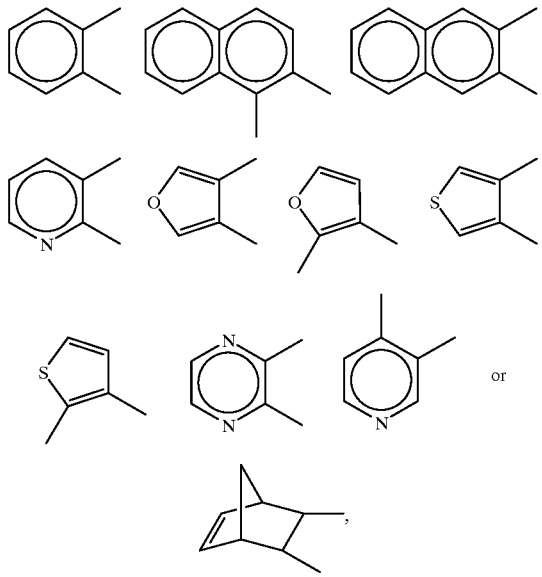

wherein $R^5$, $R^6$, $R^7$, $R^8$ independently are hydrogen or alkyl.

The right composition of the polymer of this invention requires optimization tests for the individual desired application. Developability, photosensitivity, printing ink receptivity, shelf-life under elevated humidity and temperature etc. dependent on the composition of the polymer are determined in a manner known to the person skilled in the art.

The second substantial component of the photosensitive mixture of this invention is a diazonium polycondensation product or a free radical polymerizable system, consisting of photoinitiators and unsaturated compounds, which are free radical polymerizable, or a hybrid system comprising a diazonium polycondensation product and a free radical polymerizable system comprising photoinitiators and unsaturated compounds which are free radical polymerizable.

In the photosensitive mixtures according to the invention, diazonium polycondensation products known to the person skilled in the art can be used as diazonium polycondensation product. Such condensation products may for instance be prepared in a common manner by condensation of a diazo monomer described in EP-A-0 104 863 with a condensation agent, such as formaldehyde, acetaldehyde, propionaldehyde, butyraldehyde, isobutyraldehyde or benzaldehyde. Furthermore, mixed condensation products are used which, apart from the diazonium salt units, comprise other non-photosensitive units which are derived from condensable compounds, in particular from aromatic amines, phenols, phenol ethers, aromatic thioethers, aromatic hydrocarbons, aromatic heterocycles or organic acid amides. Especially advantageous examples of diazonium polycondensation products are reaction products of diphenylamine-4-diazonium salts, optionally having a methoxy group in the phenyl group bearing the diazo group, with formaldehyde or 4,4'-bis-methoxymethyl diphenyl ether. Aromatic sulfonates such as 4-tolylsulfonate or mesitylene sulfonate, tetrafluoroborate, hexafluoro-phosphate, hexafluoroantimonate and hexafluoroaresenate are particularly suitable as anions of these diazo resins. The diazonium polycondensation product is preferably present in the photosensitive mixtures in an amount of from 3 to 60 wt. %.

The second substantial component may also be a free radical polymerizable system. This is made up of photoinitiators absorbing in the range of from 300 to 800 nm, preferably 300 to 450 nm, and free radical polymerizable components. The basic bodies and/or derivatives of acetophenone, benzophenone, (trichloromethyl)-1,3,5-triazine, benzoine, benzoine ethers, benzoine ketales, xanthone, thioxanthone, acridine or hexaryl-bis-imidazole are preferred photoinitiators for the photosensitive compositions of this invention. The free radical polymerizable component of the mixture of this invention is an acrylic or methacrylic acid derivative having one or more unsaturated group(s), preferably esters of acrylic or methacrylic acid in the form of monomers, oligomers or prepolymers. It may be present in solid or liquid form, solid and highly viscous forms being preferred. The compounds suitable as monomers include for instance trimethylol propane triacrylate and methacrylate, pentaerythritol triacrylate and methacrylate, dipentaerythrite-monohydroxy pentaacrylate and methacrylate, dipenta erythritolhexaacrylate and methacrylate, penta erythritol tetraacrylate and methacrylate, di(trimethylol propane)tetraacrylate and methacrylate, diethylene glycol diacrylate and methacrylate, triethylene glycol diacrylate and methacrylate or tetraethylene glycol diacrylate and methacrylate. Suitable oligomers and/or prepolymers are urethane acrylate and methacrylate, epoxide acrylate and methacrylate, polyester acrylate and methacrylate, polyether acrylate and methacrylate or unsaturated polyester resins. The photoinitiators and free radical polymerizable components are to be arranged in a manner known to the person skilled in the art, combinations of various photoinitiators and different free radical polymerizable components being also advantageous. The weight ratio of the photoinitiators is preferably 0.5 to 20% and that of the free radical polymerizable components 5 to 80%, based on the total solid content of photosensitive compositions.

A combination of the diazonium polycondensation products having a free radical polymerizable system comprising photoinitiators and unsaturated compounds, which are free radical polymerizable, may be advantageous for certain applications. The compositions of such hybrid systems preferably comprise 1 to 50% diazonium polycondensation products, 0.5 to 20% photoinitiators as well as 5 to 80% free radical polymerizable components.

The exposure indicators usable in the photosensitive mixtures of this invention are known to the person skilled in the art. Exposure indicators from the group of triaryl methane dyes (such as Victoria blue BO, Victoria blue R, Crystal Violet) or azo dyes (such as 4-phenyl-azo-diphenylamine, azobenzene or 4-N,N-dimethyl-amino-azo-benzene) are preferred. The exposure indicators are present in the photosensitive mixture at a ratio of 0.02 to 10 wt. %, preferably 0.5 to 6 wt. %.

Suitable dyes for improving the contrast of the image are those that dissolve well in the solvent or solvent mixture used for coating or are easily introduced in the disperse form of a pigment. Suitable contrast dyes include inter alia rhodamin dyes, methyl violet, anthrachinone pigments and phthalocyanine dyes and/or pigments.

Furthermore, the mixture of this invention may comprise stabilizing acids. These stabilizing acids include phosphoric, citric, benzoic, m-nitrobenzoic, p-anilino azobenzene sulfonic, p-toluene sulfonic or tartaric acid. In some formulations a mixture of several different acids is advantageous. Phosphoric acid is preferably used as stabilizing acid. The added acid preferably amounts to 0.2 to 6 wt. %.

The photosensitive mixture of this invention may also comprise a softening agent. Suitable softening agents include dibutyl phthalate, triaryl phosphate and dioctyl phthalate. Dioctyl phthalate is especially preferred. The amount of softening agent used is preferably 0.25 to 2 wt. %.

The photosensitive mixtures of this invention are preferably usable for producing lithographic plates. In addition, however, they may be used in recording materials for creating images on suitable carriers and receiving sheets, for creating reliefs that may serve as printing molds, screens and the like, as light-hardening varnishes for surface protection and for the formulation of UV-hardening printing inks.

For the preparation of planographic printing plates aluminum as the carrier is first roughened by brushing in a dry state, brushing with abrasive suspensions or electrochemically, e.g. in an hydrochloric acid electrolyte.

The roughened plates, which were optionally anodically oxidized in sulfuric or phosphoric acid, are then subjected to a hydrophilizing aftertreatment, preferably in an aqueous solution of polyvinyl phosphonic acid, sodium silicate or phosphoric acid. The details of the above-mentioned substrate pretreatment are well-known to the person skilled in the art.

The dried plates are then coated with the photosensitive layers of organic solvents and/or solvent mixtures so that dry layer weights of preferably from 0.5 to 4 g/m², more preferably 0.8 to 3 g/m², are obtained.

In some cases the additional application of an oxygen-impermeable top layer to the photosensitive layer might be advantageous. This is especially advantageous in free radical polymerizable systems and in the hybrid systems of diazonium polycondensation products and free radical polymerizable systems. The polymers suitable for the top layer include polyvinyl alcohol, polyvinyl alcohol/polyvinyl acetate copolymers, polyvinyl pyrrolidone, polyvinyl pyrrolidone/polyvinyl acetate copolymers, polyvinyl methyl ether, polyacrylic acid and gelatine. The thickness of the oxygen-impermeable top layer is preferably 0.1 to 4 g/m², and more preferably 0.3 to 2 g/m².

The thus obtained lithographic plates are exposed and developed as common and known to the person skilled in the art. The developed plates are usually treated with a preservative ("rubber coating"). The preservatives are aqueous solutions of hydrophilic polymers, wetting agents and other additives.

For certain uses it is furthermore advantageous to increase the mechanical strength of the printing layers by means of a heat treatment or a combined use of heat and UV radiation. For this purpose, the plate is first treated with a solution that protects the non-image areas such that the heat treatment will cause no ink receptivity in these areas. A suitable solution is described e.g. in U.S. Pat. No. 4,355,096.

The following examples serve to provide a more detailed explanation of the invention.

Preparation Example 1

301.5 g maleic anhydride are dissolved in 750 ml dried tetrahydrofuran. 3 60.6 g 2-(N-methylamino)-acetaldehyde dimethyl acetal are added drop-wise to this solution while cooled such that the temperature does not rise any higher than 20° C. Subsequently, the mixture is refluxed for 30 minutes and the solvent is distilled off by means of a vacuum rotation vaporizer. The obtained product is oily and crystallizes after a certain time. The yield is quantitative. The acid number is 253 mg KOH per gram substance.

Preparation Example 2

104 g phthalic acid anhydride are dissolved in 550 ml dried tetrahydrofuran. For better dissolution the mixture is briefly heated to boiling and then cooled to 15° C. In the course of 30 minutes, 79 g 2-(N-methylamino)-acetaldehyde dimethyl acetal are added drop-wise to this solution while cooled such that the temperature does not rise any higher than 20° C. Subsequently, the mixture is refluxed for 30 minutes and the solvent is separated by means of a vacuum rotation vaporizer. The yield is quantitative. The acid number is 196 mg KOH per gram substance.

Preparation Example 3

96 g tetrahydrophthalic acid anhydride are added to 450 ml dried tetrahydrofuran. For better dissolution the mixture is briefly heated to boiling and then cooled to 15° C. In the course of 30 minutes, 71.4 g 2-(N-methylamino)-acetaldehyde dimethyl acetal are added drop-wise to this solution while cooled such that the temperature does not rise any higher than 20° C. Subsequently, the mixture is refluxed for 30 minutes and the solvent is separated by means of a vacuum rotation vaporizer. The yield is quantitative. The acid number is 199 mg KOH per gram substance.

Preparation Example 4

75 g Mowiol 8/88® (polyvinyl alcohol available from Hoechst having a content of residual acetyl groups of approx. 21 wt. %) are dissolved in 225 ml water and 450 ml n-propanol at 70° C. in a three-necked flask equipped with cooler, stirrer and thermometer on a water bath. The solution is cooled to 60° C. and 10.2 ml concentrated hydrochloric acid are added. Subsequently, a mixture of 16.2 g butyraldehyde and 9.9 g acetaldehyde is added drop-wise and the mixture is stirred for 4 hours at 60° C. For neutralization, 10.6 g sodium carbonate dissolved in 50 ml water are added and the mixture is stirred for 30 minutes. Then, the polymer is precipitated by slowly pouring the mixture into an excess of water, it is filtered off and dried for 24 hours at 40° C. in a rotary drying chamber. The analytical examination of the product shows 28 wt. % vinyl alcohol units.

Preparation Example 5

100 g of the polymer of Preparation Example 4 are dissolved in 1,500 ml dimethyl sulfoxide under stirring. Upon addition of 10 g concentrated hydrochloric acid and 43.4 g of the reaction product of maleic anhydride with 2-(N-methylamino)-acetaldehyde dimethyl acetal of Preparation Example 1 is stirred at approx. 60° C. for 24 hours. The polymeric binder is precipitated in an excess of water and dried for 24 hours at 40° C. in a rotary drying chamber. The analytical examination of the product reveals an acid number of 21 mg KOH per gram polymer.

Preparation Example 6

25 g Mowiol 8/88® so (polyvinyl alcohol available from Hoechst having a content of residual acetyl groups of approx. 21 wt. %) are dissolved in 500 ml dimethyl sulfoxide at 70° C. Upon cooling down to 50° C., 2.5 g concentrated hydrochloric acid and, subsequently, a mixture of 2.64 g acetaldehyde and 4.32 g butyraldeyde in 20 ml dimethyl sulfoxide are added drop-wise under stirring. After a reaction time of 5 hours, 10.85 g of the reaction product from maleic anhydride with 2-(N-methylamino)-acetaldehyde dimethyl acetal of Preparation Example 1, dissolved in 30 ml dimethyl sulfoxide are added and stirred for 16 hours at 60° C. The polymeric binder is precipitated in an excess of water and dried for 24 hours at 40° C. in a rotary drying chamber. The analytical examination of the product reveals an acid number of 17 mg KOH per gram polymer.

Preparation Example 7

100 g of the polymer of Preparation Example 4 are dissolved in 785 ml dimethyl sulfoxide under stirring. Upon addition of 5.24 g concentrated hydrochloric acid and 53.8 g of the reaction product of phthalic acid anhydride with 2-(N-methylamino)-acetaldehyde dimethyl acetal of Preparation Example 2, the mixture is stirred for 24 hours at approx. 60° C. The polymeric binder is precipitated in 13 l water containing 5.2 g soda and dried for 24 hours at 40° C. in a rotary drying chamber. The analytical examination of the product reveals an acid number of 15 mg KOH per gram polymer.

Preparation Example 8

100 g of the polymer of Preparation Example 4 are dissolved in 785 ml dimethyl sulfoxide under stirring. Upon addition of 5.24 g concentrated hydrochloric acid and 53.8 g of the reaction product of tetrahydrophthalic acid anhydride with 2-(N-methylamino)-acetaldehyde dimethyl acetal of Preparation Example 3, the mixture is stirred for 24 hours at approx. 60° C. The polymeric binder is precipitated in 13 l water containing 5.2 g soda and dried for 24 hours at 40° C. in a rotary drying chamber. The analytical examination of the product reveals an acid number of 36 mg KOH per gram polymer.

Preparation Example 9

100 g of the polymer of Preparation Example 4 are dissolved in 1,500 ml 1,4-dioxane under stirring. Upon addition of 10 g concentrated hydrochloric acid and 43.4 g of the reaction product of maleic anhydride with 2-(N-methylamino)-acetaldehyde dimethyl acetal of Preparation Example 1, the mixture is stirred for 24 hours at approx. 60° C. The polymeric binder is precipitated in an excess of water and dried for 24 hours at 40° C. in a rotary drying chamber. The analytical examination of the product reveals an acid number of 18 mg KOH per gram polymer.

Preparation Example 10

100 g of the polymer of Preparation Example 4 are dissolved in 1,000 ml tetrahydrofuran under stirring. Upon addition of 10 g concentrated hydrochloric acid and 43.4 g of the reaction product of maleic anhydride with 2-(N-methylamino)-acetaldehyde dimethyl acetal of Preparation Example 1, the mixture is stirred for 4 hours at approx. 60° C. The polymeric binder is precipitated in an excess of water and dried for 24 hours at 40° C. in a rotary drying chamber. The analytical examination of the product reveals an acid number of 8 mg KOH per gram polymer.

Preparation Example 11

8.84 g maleic anhydride are dissolved in 40 ml DMSO. 9.6 g 2-(N-methylamino)-acetaldehyde dimethyl acetal are added drop-wise to this solution while cooled such that the temperature does not rise any higher than 20° C. Subsequently, the mixture is heated to 60° C. for 30 minutes.

Then 100 g Mowiol 8/88® (polyvinyl alcohol available from Hoechst having a content of residual acetyl groups of approx. 21 wt. %) are dissolved at 70° C. in 640 ml dimethyl sulfoxide and this solution is added to the above mixture. The resulting mixture of the two solutions is then stirred for 24 hours at 70° C. Subsequently, a mixture of 11.6 g butyraldehyde and 13.6 g acetaldehyde is added drop-wise under stirring and kept at 70° C. for another 5 hours. The polymeric binder is precipitated in an excess of water and dried for 24 hours at 40° C. in a rotary drying chamber. The analytical examination of the product reveals an acid number of 29 mg KOH per gram polymer.

Preparation Example 12 based on PCT WO 93/03068

A mixture of 25 g Mowiol 5/88® (polyvinyl alcohol available from Hoechst having a content of residual acetyl groups of approx. 21 wt. %), 75 ml water and 150 ml n-propanol is stirred at 70° C. for 20 hours. The solution is cooled to 60° C. Upon addition of 3.4 g concentrated hydrochloric acid, first a mixture of 5.4 g benzaldehyde, 7.4 g butyraldehyde and then 9 g phthalaldehydic acid are added over 2 hours. This mixture is stirred for 2 hours at 60° C. and soda is added in an amount to obtain a pH value of 7. By means of precipitation in water, washing the polymer with water and drying for 24 hours at 40° C., a product is obtained having an acid number of 20 mg KOH per gram polymer.

Preparation Example 13 based on DE 20 533 63

50 g Mowital B60T® (polyvinyl butyral available from Hoechst having a content of 70 wt. % acetal, of 26 wt. % vinyl alcohol and of 3 wt. % acetate) are dissolved in 752 g dried 1,4-dioxane at 40° C. Subsequently, 27.2 g p-toluene sulfonyl isocyanate is added drop-wise over 20 minutes at the same temperature. This mixture is stirred for another 4 hours at 40° C. and then the polymer is precipitated in an excess of water. Upon thorough washing with water, the product is sucked off and dried for 24 hours at 40° C. in a rotary drying chamber.

Preparation Example 14 based on EP-A-0 152 819

25 g Mowital B60T® (polyvinyl butyral available from Hoechst having a content of 70 wt. % acetal, of 26 wt. % vinyl alcohol and of 3 wt. % acetate) are dissolved in 700 ml methyl ethyl ketone at 60° C. and then, upon addition of 10 g maleic anhydride and 0.7 ml triethyl amine, refluxed for 6 hours. By means of precipitation using water, washing the polymer with water and drying for 24 hours at 40° C., a product is obtained having an acid number of 58 mg KOH per gram polymer.

Preparation Example 15 based on GB-1 396 355

100 g poly(vinylacetate-co-crotonic acid) (Mowilith CT5® available from Hoechst) are dissolved in 1,000 ml methanol. A sodium methylate solution of 2 g sodium and 40 ml methanol is added drop-wise to this solution. This mixture is refluxed for 30 minutes and the precipitated polymer particles are filtered off. Upon washing using methanol, the polymer is dried.

50 g of the thus obtained copolymer of crotonic acid, vinyl alcohol and vinyl acetate are dissolved in a mixture of 150 ml water and 300 ml n-propanol. Upon addition of 10.9 g concentrated hydrochloric acid, 10.8 g benzaldehyde and 15 g butyraldehyde are added drop-wise and the mixture is heated to 60° C. under stirring for 4 hours. It is neutralized using 5 g soda. By means of precipitation using water, washing the polymer with water and drying for 24 hours at 40° C., a product is obtained having an acid number of 3 mg KOH per gram polymer.

EXAMPLE 1

A coating solution is prepared from the following components:

| | |
|---|---|
| 4.38 g | Binder of Preparation Example 5 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The printing layer is exposed under a silver film halftone step wedge having a tonal range of 0.15 to 1.95, wherein the density increments amount to 0.15, to give a negative model using a metal halogenide lamp (MH burner, available from W. Sack) of 300 mJ/cm².

The exposed coating is treated for 30 seconds with a developer solution comprising 3.4 parts by weight Rewopol NLS 28® (available from REWO)

1.8 parts by weight 2-phenoxy ethanol 1.1 parts by weight diethanol amine 1.0 parts by weight Texapon 842® (available from Henkel)

0.6 parts by weight Nekal BX Paste® (available from BASF)

0.2 parts by weight 4-toluene sulfonic acid 91.9 parts by weight water.

Then the developer solution is again rubbed over the surface for another 30 seconds using a tampon and then the entire plate is rinsed with water. After this treatment the exposed portions remain on the plate. For the assessment of its photosensitivity, the plate is blackened in a wet state using a printing ink.

The plate's ink receptivity is good and exposed microscopic lines are very well reproduced. The gray wedge is completely covered up to step 4 and partially covered up to step 8.

For the preparation of a lithographic plate a printing layer is applied to the aluminum foil, as explained above, exposed, developed and after rinsing with water the developed plate is wiped and rubbed with an aqueous solution of 0.5% phosphoric acid and 6% gum arabic. The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 2

A coating solution is prepared from the following components:

| | |
|---|---|
| 5.88 g | Binder of Preparation Example 5 |
| 2.5 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The printing layer is exposed, developed, blackened and printed as described in Example 1.

The plate's ink receptivity is good and exposed microscopic lines are very well reproduced. The gray wedge is completely covered up to step 4 and partially covered up to step 11.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 3

A coating solution is prepared from the following components:

| | |
|---|---|
| 5.43 g | Binder of Preparation Example 5 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 0.5 g | Victoria blue (C.I. Solvent Blue 5) |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The printing layer is exposed, developed, blackened and printed as described in Example 1.

The plate's ink receptivity is good and exposed microscopic lines are very well reproduced. The gray wedge is completely covered up to step 2 and partially covered up to step 8.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 4

A coating solution is prepared from the following components:

| | |
|---|---|
| 4.38 g | Binder of Preparation Example 7 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m$^2$.

The printing layer is exposed, developed, blackened and printed as described in Example 1.

The plate's ink receptivity is good and exposed microscopic lines are very well reproduced. The gray wedge is completely covered up to step 3 and partially covered up to step 8.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 5

A coating solution is prepared from the following components:

| | |
|---|---|
| 4.38 g | Binder of Preparation Example 8 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m$^2$.

The printing layer is exposed, developed, blackened and printed as described in Example 1.

The plate's ink receptivity is good and exposed microscopic lines are very well reproduced. The gray wedge is completely covered up to step 4 and partially covered up to step 9.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 6

A coating solution is prepared from the following components:

| | |
|---|---|
| 5.88 g | Binder of Preparation Example 6 |
| 2.5 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m$^2$.

The printing layer is exposed, developed, blackened and printed as described in Example 1.

The plate's ink receptivity is good and exposed microscopic lines are very well reproduced. The first step of the gray wedge is completely covered and those up to step 9 are partially covered.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 7

A coating solution is prepared from the following components:

| | |
|---|---|
| 4.38 g | Binder of Preparation Example 5 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of sodium silicate by means of common methods and the coating is dried for 4 minutes at 90° C. The weight of the printing layer amounts to approx. 1 g/m$^2$.

The printing layer is exposed, developed, blackened and printed as described in Example 1.

The plate's ink receptivity is good and exposed microscopic lines are very well reproduced. The gray wedge is completely covered up to step 3 and partially covered up to step 10.

The thus prepared plate is loaded in a sheet-fed offset printing machine and under normal printing conditions provides 200,000 copies of good quality. The plate could be used for more prints.

EXAMPLE 8

A coating solution is prepared from the following components:

| | |
|---|---|
| 1.5 g | Binder of Preparation Example 5 |
| 0.6 g | of a terpolymer prepared by polymerization of 476 parts by wt. styrene, 476 parts by wt. methyl methacrylate and 106 parts by wt. methacrylic acid |
| 5.24 g | of a 80% methyl ethyl ketone solution of an urethane acrylate prepared by reacting Desmodur N 100 ® (available from Bayer) comprising hydroxy ethyl acrylate and pentaerythritol triacrylate having a double-bond content of 0.5 double bonds/100 g when all isocyanate groups are completely reacted |
| 1.29 g | dipentaerythritol pentaacrylate |
| 0.6 g | 2,4-trichloromethyl-6[(4-ethoxyethylenoxy) naphthyl]-1,3,5-triazine |
| 0.16 g | 4,4'-N,N-diethylaminobenzophenone |
| 0.2 | benzophenone |
| 0.19 g | 3-mercapto-1,2,4-triazol |
| 0.12 g | Renol blue B2G-HW ® (copper phthalocyanine pigment dispersed in polyvinyl butyral available from HOECHST) |
| 0.1 g | leuco Crystal Violet. |

These components are dissolved under stirring in 100 ml of a mixture comprising 35 parts by volume methyl glycol 25 parts by volume methanol 40 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1.85 g/m$^2$.

Then, an oxygen-impermeable layer of 1.7 g/m$^2$ dry layer weight was applied analogously by applying a coating of an aqueous solution of the following composition:

| | |
|---|---|
| 50 g | polyvinylalcohol (Airvol 203 ® available from Airproducts; 12% residual acetyl groups) |
| 270 g | water. |

Drying also took place for 5 minutes at 95° C.

The plate is exposed as described in Example 1; however, the amount of light is 10 mJ/cm$^2$. Immediately upon exposure, the plates were heated to 95° C. for 1 minute in order to amplify the photo polymerization taking place. Developing and blackening takes place as described in Example 1.

The plate's ink receptivity is good. The gray wedge is completely covered up to step 4 and partially covered up to step 6.

The thus prepared plate is loaded in a sheet-fed offset printing machine and under normal printing conditions provides 200,000 copies of good quality. The plate could be used for more prints.

EXAMPLE 9

A coating solution is prepared from the following components:

| | |
|---|---|
| 5.2 g | Binder of Preparation Example 5 |
| 2.88 g | of a 80% methyl ethyl ketone solution of an urethane acrylate prepared by reacting Desmodur N 100 ® (available from Bayer) comprising hydroxy ethyl acrylate and pentaerythritol triacrylate having a double-bond content of 0.5 double bonds/100 g when all isocyanate groups are completely reacted |
| 1.42 g | dipentaerythritol pentaacrylate |
| 0.165 g | 2-(4-methoxy-naphth-1-yl)-4,6-bis-(trichloromethyl)-s-triazine |
| 0.33 g | polycondensation product from 1 mole 3-methoxy diphenylamine-4-diazonium sulfate and 1 mole 4,4'-bis-methoxymethyldiphenyl ether precipitated as mesitylene sulfonate |

-continued

| | |
|---|---|
| 0.165 g | Victoria blue (C.I. Solvent Blue 5) |
| 0.12 g | 4-phenyl-azo-diphenylamine |
| 0.05 g | phosphoric acid. |

These components are dissolved under stirring in 200 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

Then oxygen-impermeable layer of 0.3 g/m² dry layer weight was applied analogously by applying a coating of an aqueous solution of the following composition:

| | |
|---|---|
| 50 g | polyvinylalcohol (Airvol 203 ® available from Airproducts; 12% residual acetyl groups) |
| 270 g | water. |

Drying Also took place for 5 minutes at 95° C.

The is exposed, developed, blackened and printed as described in Example 1.

The plate's ink receptivity is good and exposed microscopic lines are very well reproduced. The first step of the gray wedge is completely covered and those up to step 11 are partially covered.

The thus prepared plate is loaded in a sheet-fed offset printing machine and under normal printing conditions provides 200,000 copies of good quality. The plate could be used for more prints.

EXAMPLE 10

A coating solution is prepared from the following components:

| | |
|---|---|
| 4.38 g | Binder of Preparation Example 9 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed, blackened and printed as described in Example 1.

The plate's ink receptivity is good and exposed microscopic lines are very well reproduced. The gray wedge is completely covered up to step 3 and partially covered up to step 9.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 11

A coating solution is prepared from the following components:

| | |
|---|---|
| 4.38 g | Binder of Preparation Example 10 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed, blackened and printed as described in Example 1.

The plate's ink receptivity is good and exposed microscopic lines are very well reproduced. The gray wedge is completely covered up to step 3 and partially covered up to step 9.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

EXAMPLE 12

A coating solution is prepared from the following components:

| | |
|---|---|
| 4.38 g | Binder of Preparation Example 11 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |

-continued

| | |
|---|---|
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m$^2$.

The plate is exposed, developed, blackened and printed as described in Example 1.

The plate's ink receptivity is good and exposed microscopic lines are very well reproduced. The gray wedge is completely covered up to step 3 and partially covered up to step 9.

The thus prepared plate is loaded in a sheet-fed offset printing machine and under normal printing conditions provides 200,000 copies of good quality. The plate could be used for more prints.

To simulate aging of the plates, they are stored for 10 days at a temperature of 40° C. and 80% relative humidity. The thus treated plates are used for printing in a sheet-fed offset printing machine and exhibit no change in their printing behavior in comparison to the plates that were not artificially aged.

Comparative Example 1

A coating solution is prepared from the following components:

| | |
|---|---|
| 4.38 g | Polyvinyl butyral having an average molecular weight of 30,000 containing 70 wt. % butyral units, 27 wt. % vinyl alcohol units and 3 wt. % vinyl acetate units |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m$^2$.

The plate is exposed, developed and blackened as described in Example 1.

The thus prepared plates prove to be very hard to develop. Unexposed areas can only be freed from coating residues clinging to them by means of strong mechanic support. The unexposed portions of the coating are partially insoluble in the developer and tend to form deposits on the plate and in the machines used in the developing process. The resolution is poor since the spaces between fine details are not developed properly.

Comparative Example 2

A coating solution is prepared from the following components:

| | |
|---|---|
| 4.38 g | Binder of Preparation Example 4 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m$^2$.

The plate is exposed, developed and blackened as described in Example 1.

The reproduction of fine halftone dots is sufficient. The first step of the gray wedge is completely covered and those up to step 7 are partially covered.

In comparison, the polymers prepared according to the invention exhibit a higher sensitivity.

To simulate aging of the plates, they are stored for 10 days at a temperature of 40° C. and 80% relative humidity. The thus treated plates are used for printing in a sheet-fed offset printing machine and exhibit enormous wear of the solids as early as after 50,000 copies under normal conditions.

Comparative Example 3

A coating solution is prepared from the following components:

| | |
|---|---|
| 5.43 g | Binder of Preparation Example 12 |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 0.5 g | Victoria blue (C.I. Solvent Blue 5) |
| 0.07 g | phosphoric acid. |

These components are dissolved under stirring in 200 ml of a mixture comprising 30 parts by volume methyl glycol 45 parts by volume methanol 25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed and blackened as described in Example 1.

The gray wedge is completely covered up to step 2 and partially covered up to step 7. In comparison, the polymers prepared according to the invention exhibit a higher sensitivity.

Furthermore, the plate required at least 15 seconds developing time in comparison to 5 seconds in case of the printing molds of this invention. In fast developing machines and developers close to exhaustion, this leads to plates that are not properly developed.

Comparative Example 4

A coating solution is prepared from the following components:

| | |
|---|---|
| 6.38 g | Polymer of Preparation Example 13 |
| 2 g | polycondensation product from 1 mole 3-methoxy diphenylamine-4-diazonium sulfate and 1 mole 4,4'-bis-methoxymethyldiphenyl ether precipitated as mesitylene sulfonate |
| 1.5 g | Renol blue B2G-HW ® (copper phthalocyanine pigment dispersed in polyvinyl butyral available from HOECHST) |
| 0.05 g | 4-phenyl-azo-diphenylamine |
| 0.07 g | phosphoric acid. |

These components are dissolved under stirring in 200 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed and blackened as described in Example 1.

The ink receptivity is not as good as that of the lithographic plates prepared according to the invention. The gray wedge is completely covered up to step 2 and partially covered up to step 8.

The thus prepared plate is loaded in a sheet-fed offset printing machine and after 100,000 copies under normal printing conditions exhibits an enormous loss of microelements and beginning wear of the solids.

Comparative Example 5

A coating solution is prepared from the following components:

| | |
|---|---|
| 5.85 g | Polymer of Preparation Example 14 (based on EP-A-0 152 819) |
| 3 g | polycondensation product from 1 mole 3-methoxy diphenylamine-4-diazonium sulfate and 1 mole 4,4'-bis-methoxymethyldiphenyl ether precipitated as mesitylene sulfonate |
| 1 g | Renol blue B2G-HW ® (copper phthalocyanine pigment dispersed in polyvinyl butyral available from HOECHST) |
| 0.05 g | 4-phenyl-azo-diphenylamine |
| 0.1 g | phosphoric acid. |

These components are dissolved under stirring in 200 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed, blackened and printed as described in Example 1.

The reproduction of fine halftone dots is sufficient. The first step of the gray wedge is completely covered and those up to step 7 are partially covered.

In comparison, the polymers prepared according to the invention exhibit a higher sensitivity.

Comparative Example 6

A coating solution is prepared from the following components:

| | |
|---|---|
| 5.45 g | Scripset 540 ® (butyl semi-ester of the maleic acid anhydride/styrene copolymer available from Monsanto) |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 0.5 g | Victoria blue (C.I. Solvent Blue 5) |
| 0.05 g | phosphoric acid. |

These components are dissolved under stirring in 100 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed, blackened and printed as described in Example 1.

The ink receptivity during manual blackening of the plate is insufficient and exposed microscopic lines are poorly reproduced. The first step of the gray wedge is completely covered and those up to step 7 are partially covered.

The thus prepared plate is loaded in a sheet-fed offset printing machine. During printing the plate's ink receptivity is poor, in particular the ink receptivity of the solids being spotted. After 100,000 copies considerable wear in the solids as well as in the halftone dots becomes apparent.

The results show that the ink receptivity of and the consistency in the number of prints produced by lithographic plates containing binders of this invention is significantly superior.

Comparative Example 7

A coating solution is prepared from the following components:

| | |
|---|---|
| 5.45 g | CAP ® (cellulose-acetate/phthalate available from Eastman Kodak) |
| 4 g | polycondensation product from 1 mole 3-methoxy diphenylamine-4-diazonium sulfate and 1 mole 4,4'-bis-methoxymethyldiphenyl ether precipitated as mesitylene sulfonate |
| 0.5 g | Victoria blue (C.I. Solvent Blue 5) |
| 0.05 g | phosphoric acid. |

These components are dissolved under stirring in 100 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed, blackened and printed as described in Example 1.

The ink receptivity during manual blackening of the plate and the sensitivity are insufficient (first step of the gray wedge is completely covered and those up to step 5 are partially covered).

The thus prepared plate is loaded in a sheet-fed offset printing machine. During printing the plate's ink receptivity is poor, in particular the ink receptivity of the solids being spotted. After 60,000 copies considerable wear in the solids as well as in the halftone dots becomes apparent.

The results show that the ink receptivity and photosensitivity of and the consistency in the number of prints produced by lithographic plates containing binders of this invention is significantly superior.

Comparative Example 8

A coating solution is prepared from the following components:

| | |
|---|---|
| 6.43 g | Binder of Preparation Example 15 |
| 3 g | polycondensation product from 1 mole 3-methoxy diphenylamine-4-diazonium sulfate and 1 mole 4,4'-bis-methoxymethyldiphenyl ether precipitated as mesitylene sulfonate |
| 0.5 g | Victoria blue (C.I. Solvent Blue 5) |
| 0.07 g | phosphoric acid. |

These components are dissolved under stirring in 200 ml of a mixture comprising 30 parts by volume methyl glycol
45 parts by volume methanol
25 parts by volume methyl ethyl ketone.

After filtering the solution, it is applied to an electrochemically roughened and anodized aluminum foil that was subjected to an aftertreatment using an aqueous solution of polyvinyl phosphonic acid by means of common methods and the coating is dried for 4 minutes at 90° C. The weight of the printing layer amounts to approx. 1 g/m².

The plate is exposed, developed and blackened as described in Example 1.

The first two steps of the gray wedge are completely covered and those up to step 7 are partially covered. In comparison, the polymers prepared according to this invention exhibit a higher sensitivity. Besides, the gray wedge before blackening is 3 steps shorter, i.e. the sensitivity appears higher than it is due to minimal remaining coating residues. In comparison to plates prepared according to this invention, the reproduction of micro-elements is poor, a fact which shows in too few open dark portions of blackened plates.

Furthermore, the plate requires at least 20 seconds developing time in comparison to 5 seconds in case of the printing molds of this invention. In fast developing machines and developers close to exhaustion, this leads to plates that are not properly developed.

We claim:

1. A polymer binder containing the units A, B, C, D and E, wherein A is present in an amount of 10 to 60 mole % and is of the formula

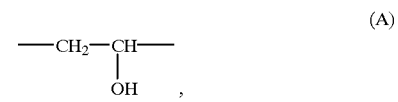

B is present in an amount of 1 to 30 mole % and is of the formula

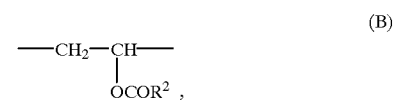

C is present in an amount of 5 to 60 mole % and is of the formula

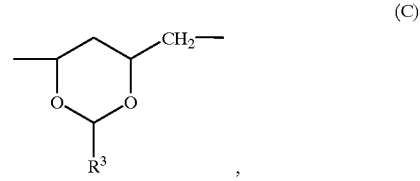

D is present in an amount of 0 to 60 mole % and is of the formula

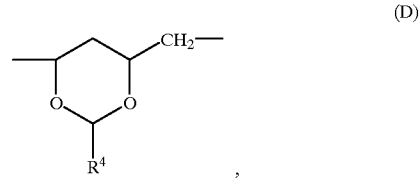

and E is present in an amount of 1 to 40 mole % and is of the formula

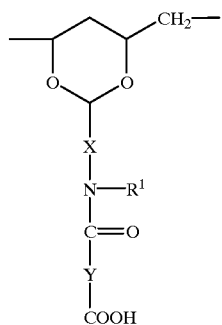 (E)

wherein
X is an aliphatic, aromatic or araliphatic spacer group,
R$^1$ is hydrogen or an aliphatic, aromatic or araliphatic group,
R$^2$, R$^3$ and R$^4$ are hydrogen or alkyl groups with carbon numbers of from 1 to 18 and
Y is a saturated or unsaturated chain- or ring-shaped spacer group.

2. The binder of claim 1 containing one of the following spacer groups Y:
—CR$^5$R$^6$—CR$^7$R$^8$—, —CR$^5$=CR$^6$—,

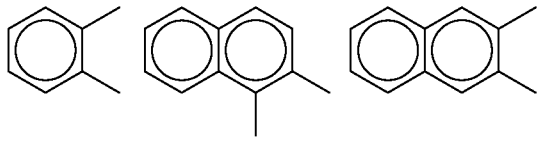

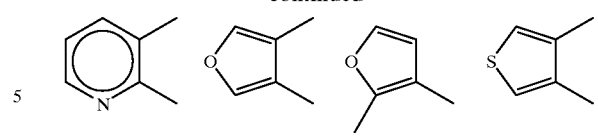

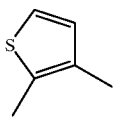 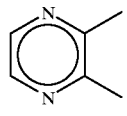 or

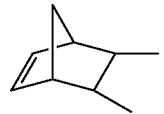

wherein R$^5$, R$^6$, R$^7$, R$^8$ each are independently hydrogen or alkyl.

3. The binder of claim 1, wherein R$^1$ is hydrogen or alkyl and the spacer group X is a —CH$_2$, —CH(CH$_3$) or —CH$_2$CH$_2$CH$_2$ group.

4. The binder of claim 1, wherein R$^2$ is CH$_3$ and R$^3$ and R$^4$ are aliphatic groups with carbon numbers of from 1 to 6.

* * * * *